United States Patent [19]

Engelmann

[11] 3,728,637

[45] Apr. 17, 1973

[54] SEMICONDUCTOR ARRANGEMENT FOR NONRECIPROCAL AMPLIFICATION OR GENERATION OF OSCILLATIONS IN THE MICROWAVE RANGE

[75] Inventor: Reinhart Engelmann, Ulm/Donau, Germany

[73] Assignee: Licentia Patent-Verwaltungs-G.m.b.H., Frankfurt am Main, Germany

[22] Filed: Aug. 27, 1970

[21] Appl. No.: 67,500

[30] Foreign Application Priority Data

Aug. 28, 1969 Germany....................P 19 43 676.1
Feb. 27, 1970 Germany....................P 20 09 142.3

[52] U.S. Cl.....................................330/5, 331/107 G
[51] Int. Cl.....................................H03f 3/04
[58] Field of Search........................330/5; 331/107 G

[56] References Cited

UNITED STATES PATENTS 3,516,019 6/1970 Kroemer et al..........................330/5
3,526,844 9/1970 Bartelink et al.........................330/5
3,551,831 12/1970 Kino et al...............................330/5

*Primary Examiner*—Roy Lake
*Assistant Examiner*—Darwin R. Hostetter
*Attorney*—Spencer & Kaye

[57] ABSTRACT

A semiconductor arrangement for nonreciprocal amplification or for the generation of high frequency oscillations in which high frequency electromagnetic energy is coupled into a semiconductor layer which exhibits a negative differential charge carrier mobility in a direction perpendicular to the applied drift field and has a predetermined layer thickness in this perpendicular direction thereby exciting properly growing space charge waves. The arrangement may be geometrically symmetrical in this perpendicular direction and may have either symmetrical or antisymmetrical coupling and decoupling means for the high frequency electromagnetic energy thereby exciting and removing space charge waves of the symmetrical or antisymmetrical type, respectively.

13 Claims, 5 Drawing Figures

Inventor:
Reinhart Engelmann

BY Spencer & Kaye
ATTORNEYS.

SEMICONDUCTOR ARRANGEMENT FOR NONRECIPROCAL AMPLIFICATION OR GENERATION OF OSCILLATIONS IN THE MICROWAVE RANGE

BACKGROUND OF THE INVENTION

The present invention relates to a semiconductor arrangement for the nonreciprocal amplification or for the generation of oscillations, particularly in the microwave range. More particularly, this invention relates to such an arrangement having a relatively long and wide semiconductor body in layer form in which charge carriers move due to a drift field which is applied thereto via ohmic contacts. The semiconductor body is provided with means for coupling in and/or decoupling high frequency electromagnetic waves hereby exciting and/or removing properly growing space charge waves.

The amplification of a space charge wave utilizing the interaction of drifting charge carriers in semiconductors with an applied electromagnetic wave, the wave being appropriately delayed or receiving standing wave characteristics by a metallic strip structure applied to the semiconductor surface in an electrically insulated manner, is already known. The high technical demands placed on the manufacture of such a metallic strip strucutre, however, have thus far prevented the use of such amplifiers in practice. The aforesaid amplifier is described in IEE Trans., Vol. ED–16, Number 1, January 61, pp 88 – 97 by M.E. Hines in "Theory of Space-Harmonic Traveling-Wave Interactions in Semiconductors."

It is also known to produce a nonreciprocal amplification by space charge waves in semiconductors by applying a supercritical electrical drift field thereto. The semiconductor bodies employed for this purpose, e.g., gallium arsenide, indium phosphid or germanium, exhibit the property of a longitudinal negative differential charge carrier mobility, i.e., in the direction of the drift of the charge carriers. To stabilize this negative mobility it is advantageous to produce the semiconductor body in the form of a layer of semiconductor material and to surround it with a dielectric material having a desired dielectric constant. However, since the above-mentioned property occurs only in semiconductors whose technological manufacture in difficult and expensive, such as III–V and II–VI compounds or appears only at relatiely low temperatures or relatively high mechanical pressures, as for germanium, this type of amplifier has also not as yet found acceptance in practice.

G.S. Kino and P.N. Robson has described "The Effect of Small Transverse Dimensions of the Operation of Gunn Devices" in Proc. IEE, Vol. 56, November 1968, pp 2056 – 2057.

SUMMARY OF THE INVENTION

The above-mentioned drawbacks of the prior art amplifiers or oscillators of this type are overcome according to the present invention by providing an improved arrangement incuding a relatively long and wide semiconductor body in layer form and of the type of material wherein charge carriers move with a negative differential mobility due to an applied critical field; means for applying a drift field, via ohmic contacts, to the semiconductor body so that charge carriers drift in the semiconductor body in the longitudinal direction; means for coupling electromagnetic waves in and/or out of the semiconductor body; and wherein the semiconductor body exhibits a negative differential charge carrier mobility in a direction which extends perpendicular, i.e., transverse, to the drift field, and the semiconductor body has a predetermined layer thickness in the direction of this transverse negative charge carrier mobility which layer thickness is related to the transverse wavelength of the space charge waves in the semiconductor body of the particular arrangement.

According to different embodiments of the invention the arrangement may be geometrically symmetrical in the direction of the transverse negative charge carrier mobility and the coupling of the high frequency electromagnetic waves may be in either a symmetric or an antisymmetric manner thereby exciting and removing space charge waves of the symmetrical or antisymmetrical type respectively.

DESCRIPTION OF THE PREFERRED EMBODIMENTS

The present invention is based on the prior art semiconductor arrangements described above and on a semiconductor body that exhibits a negative differential charge carrier mobility which extends in a direction perpendicular to the drift field, i.e., in the transverse, and has a predetermined layer thickness in the direction of this negative differential charge carrier mobility. The property of transverse direction negative differential mobility has been detected and described for germanium with a special crystal orientation by M. Shyam and H. Kroemer in Applied Physics Letters, Vol. 12, Number 9, 1st may 1968, pp 283 – 285 in "-Transverse Negative Differential Mobilities for hot Electrons and Domain Formation in Germanium."

Figure 1:
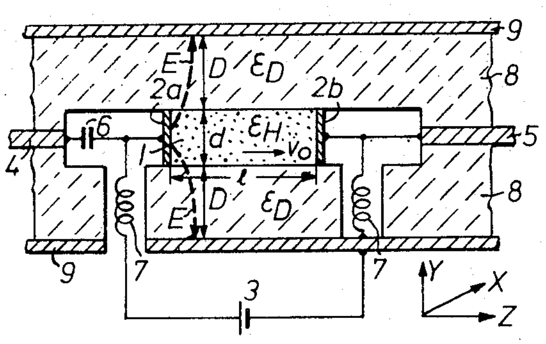
FIG. 1 is a cross-sectional view of one geometrically symmetrical embodiment of the invention with symmetrical coupling.

FIG. 1 is a sectional view of an arrangement constructed according to the present invention in which the arrangement is symmetrical both as to geometry and coupling in the Y direction, i.e., in the direction of the transverse negative charge carrier mobility. As shown in the figure, the semiconductor body or layer 1, which is formed of a suitable material, has a strip-shaped design with its thickness *d* in the Y direction, i.e., in the direction of its transverse negative charge carrier mobility, being so selected that the transverse negative charge carrier mobility in the semiconductor material employed, according to certain relationships to be set forth below, can be directly utilized for propogation by the space charge wave which are excited in the semiconductor body as modulated upon the charge carriers drifting therein in the longitudinal direction, i.e., the z direction with a speed $v_0$. The dimension of the semiconductor body 1 in the X direction, i.e., perpendicular to the plane of the drawing in FIG. 1, is selected to be large compared to the thickness *d* of the semiconductor body, but can otherwise be selected at random. The length *l* of the semiconductor body in the drift direction, i.e., the Z direction, is selected to be substantially larger than the transverse wavelength of the space charge waves in the semiconductor body. In order to apply a critical drift field to the semiconductor body 1, ohmic contacts 2*a* and 2*b* are provided at its frontal faces or transverse edges, between which an external electric field is applied from a bias voltage source 3 in such a manner that the charge carriers within semiconductor body 1 drift from contact 2*a* to contact 2*b*. High frequency chokes 7 and 7' are inserted in the input leads from the voltage source 3 to prevent the high frequency energy from flowing into the source 3.

The semiconductor body 1 is mounted on a body 8 of dielectric material so that the dielectric body 8 supports the semiconductor body along at least one and preferably both of its longitudinal surfaces, i.e., in the XZ plane. To couple and/or decouple electromagnetic high frequency oscillations to or from the semiconductor body, coupling means are provided which include at least one conductive base plate 9 on the outer surface of the dielectric body 8, and conductors 4 and 5, which in the illustrated embodiment, may be thin conductive layers or coatings. The conductors 4 and 5 and the base plate 9 thus provide high frequency connections to the semiconductor body 1. The conductor 5 is connected directly with the associated ohmic contact 2*b*, whereas conductor 4 is connected with the respective ohmic coating 2*a* of semiconductor body 1 via a capacitor 6 which serves to block the applied direct voltage. The separation of the direct and high frequency voltages can also be realized by appropriately designed filtering arrangements which are of advantage particularly when a keyed direct voltae is employed.

The arrangement according to the present invention shown in FIG. 1 is so designed in a manner well known in the art that the coupling conductors 4,5 in conjunction with semiconductor body 1 and the base plate 9 form a waveguide for the high frequency energy. Preferably, as illustrated, the waveguide may be a stripline which will be shielded on both sides by utilizing two conductive base plates 9.

If the arrangement illustrated in FIG. 1 is intended to serve as an amplifier, the electromagnetic wave to be amplified is applied between conductor 4 and base plate 9 and the amplifier wave is coupled out between conductor 5 and base plate 9. An electromagnetic wave applied in the opposite direction i.e., between conductor 5 and base plate 9 is not amplified by the arrangement due to the nonreciprocal amplification mechanism which is based on the nature of the space charge waves.

As a variation of the embodiment illustrated in FIG. 1, the coupling in and out of the high frequency power or energy can also be done with the aid of additional contacts which are disposed on the surface of the semiconductor body 1 and which take the place of base plate 9. The decisive factor with respect to the coupling of the high frequency energy is only that the coupling must occur in such a manner that the resulting high frequency electric fields exhibit both transverse field components in the Y direction and field components which extend in a longitudinal direction within the semiconductor body.

With suitable feedback connections, the arrangement of FIG. 1 can also be used as oscillator, particularly for microwaves. With the aid of an additionally coupled-in electromagnetic wave, e.g., with the use of additional contacts on the semiconductor surface, it is possible to additionally influence the amplified or generated microwave oscillations.

In the geometrically symmetrical embodiment of the invention with symmetrical coupling illustrated in FIG. 1, the following requirements for the various parameters must be met to ensure proper growth of the excited space charge waves:

$$(2n-1)/2\,\lambda_{tr} < k < d < n\lambda_{tr}$$

and moreover, as already known for space charge wave amplifiers with semiconductors having a longitudinal negative differential mobility, $$l >> \lambda_{tr}, \text{ and}$$

$$b >> d,$$

where

*d* is the thickness of the semiconductor body in the direction of its transverse negative differential mobility, i.e., the Y direction;

$\lambda_{tr}$ is the transverse wavelength of the space symmetrical charge waves in the semiconductor body;

*k* is a critical thickness which depends on the material of the semiconductor body and that of the adjacent dielectric material;

*l* is the length of the semiconductor body in the direction of drift, i.e., the Z direction;

*b* is the width of the semiconductor body in the direction perpendicular to the direction of drift and perpendicular to the direction of negative charge carrier mobility, i.e., the X direction; and

*n* is a positive integer.

If the semiconductor layer thickness *d* is below $(2n-1\lambda_{tr}/2$ or beyond $n\lambda_{tr}$ the particular space charge wave of transverse order n and of symmetric type decays. For semiconductor layer thickness below the critical value *k* the growth of this particular space charge wave becomes excessive thus forming transverse domains of the type described by Shyam and Kroemer. This would destroy the linear properties of the amplifier.

The longitudinal wavelength $\lambda_l$ is linked with the angular frequency $\omega$ of the high frequency to be amplified by a dispersion relationship of the space charge waves which also determines the degree of the amplification to be expected. Furthermore, the following approximation applies:

$$\lambda_{tr} \approx \lambda_l \sqrt{-\mu_{tr}/\mu_l},$$

where the transverse differential charge carrier mobility $\mu_{tr}$ is less than zero and the longitudinal differential charge carrier mobility $\mu$ is greater than zero. For the above-mentioned critical thickness $k$ the following approximation applies:

$$k \approx \lambda_{tr}/\pi \arctan(-\lambda_l/\lambda_{tr} \cdot \epsilon^*_D/\epsilon_H),$$

where $\epsilon^*_D$ is an effective dielectric constant of the dielectric material 8, which surrounds the semiconductor body; and $\epsilon_H$ is the dielectric constant of the semiconductor body.

In the case where the width D of the dielectric body 8 is substantially larger in the Y direction than the longitudinal wavelength $\lambda_l$, the effective dielectric constant becomes $\epsilon^*_D = \epsilon_D$. When the width D is substantially less than the longitudinal wavelength $\lambda_l$, and with a conductive layer 9 on the dielectric material 8, $$\epsilon^*_D = \lambda_l/2\pi D\,\epsilon_D,$$

where $\epsilon_D$ is the actual dielectric constant of the dielectric material 8.

Figure 2A:
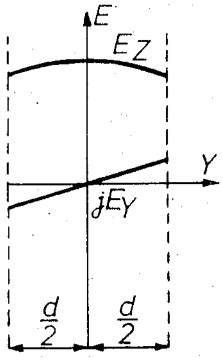
FIG. 2*a* shows the alternating electric field distribution in the semiconductor body for the amplified or growing space charge when the lowest symmetrical transverse order is employed for the longitudinal negative differential charge carrier mobility according to the prior art.
Figure 2B:
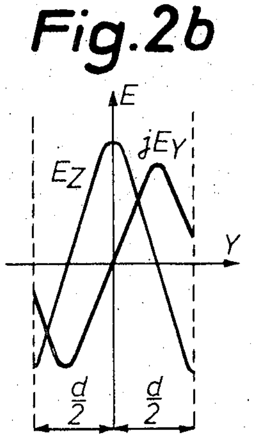
FIG. 2*b* shows the alternating electric field distribution in the semiconductor body of FIG. 1 for the amplified space charge wave of the lowest symmetrical transverse order for transverse negative differential charge carrier mobility according to the invention.

The curves of FIGS. 2*a* and 2*b* show a comparison of the alternating electric field distribution for symmetric space charge waves in the semiconductor body according to the prior art and according to the invention. FIG. 2*a* shows the alternating electric field distribution in the semiconductor body 1 for the amplified or growing space charge wave when the lowermost transverse order for the longitudinal negative differential charge carrier mobility, i.e., in the Z direction, is employed according to the prior art arrangements. For comparison purposes, FIG. 2*b* shows the alternating electric field distribution in the semiconductor body 1 for the amplified or growing space charge wave of the lowermost transverse order for transverse negative differential charge carrier mobility, i.e., in the Y direction. It can be seen in FIG. 2*b*, which shows the alternating electric field distribution in the semiconductor body perpendicular to the plane of the layer for the lowermost order when the transverse mobility is negative, that substantially thicker semiconductor layers can be used. This means that it is substantially much easier to amplify or generate power of higher frequencies with the arrangement according to the invention than in the case illustrated in FIG. 2*a*. In case the arrangement is not completely symmetrical in the Y direction the predetermined layer thickness d may deviate slightly from the above indicated criterion.

The semiconductor material employed for the semiconductor body 1 may be a technologically advanced semiconductor, preferably formed epitaxially, such as *n*-conductive germanium, which, when a critical drift field is applied in the < 110 > crystal direction, exhibits a transverse negative mobility perpendicular thereto in the <001> crystal direction under normal pressure and at room temperature.

Still today this negative transverse mobility is known only in germanium, of course other materials with the same properties, if found in future, can be used. Any dielectricum my be used, for instance polyterephthalate, barium titanate ($BaTiO_3$), aluminium oxide, ($Al_2O_3$), beryllium oxide, ($Be_2O_3$).

According to another embodiment of the present invention, a semiconductor arrangement may be provided which permits the coupling in or out of the semiconductor body of an antisymmetrical alternating electrical field thereby exciting or removing space charge waves of the antisymmetrical type.

Figure 3:
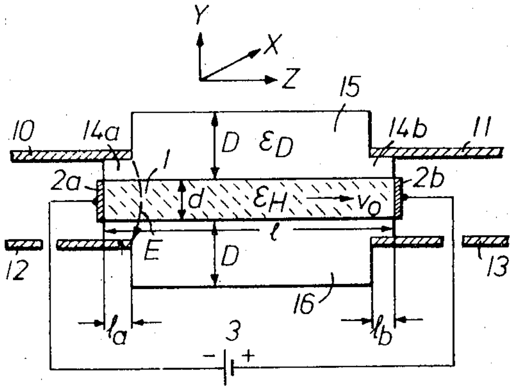
FIG. 3 is a cross-sectional view of a further geometrically symmetrical embodiment of the invention with antisymmetrical coupling.

FIG. 3 is a sectional view of such an arrangement, which although it is geometrically symmetrical in the Y direction, is provided with a coupling design which produces an antisymmetrical high frequency field distribution in the Y direction. In this embodiment the following relationships for the parameters of the semiconductor arrangement must be met to: ensure proper operation, i.e., growth of the excited space charge wave.

$$(2n-1)/2\,\lambda_{tr} > d > k' > (n-1)\,\lambda_{tr}$$

$$k' \approx \lambda_{tr}/\pi \arctan(\lambda_{tr}/\lambda_l \cdot \epsilon_H/\epsilon^*_D)$$

and moreover, as already known for space charge wave amplifiers with semiconductors having a negative longitudinal differential charge carrier mobility, $$l >> \lambda_{tr},\ b >> d,$$

where $k'$ is a critical thickness which depends on the material of the semiconductor body and the adjacent dielectric material, and the remaining terms are thesame as those defined with respect to the embodiment of FIG. 1. If the semiconductor layer thickness $d$ in below $(n-1)\lambda_{tr}$ or beyond $(2n-1)\lambda_{tr}/2$ the particular space charge wave of transverse order $n$ and of antisymmetric type decays. For semiconductor layer thicknesses below the critical value $k'$ the growth of this particular space charge wave beomces excessive thus destroying the linear properties of the amplifier.

In the embodiment of FIG. 3 the semiconductor body 1 has a strip-shaped, i.e., layer, form, with its thickness $d$ in the Y direction, i.e., in the direction of its transverse negative charge carrier mobiity being so selected that the transverse negative charge carrier mobility in the semiconductor material employed, according to the above relationship, can be directly utilized for proper growth by the antisymmetrical space charge waves which are excited in the semiconductor body 1 as modulated upon the charge carriers drifting in the longitudinal direction, i.e. the Z direction, at a speed $v_0$. The dimension of the semiconductor body in the X direction, i.e., perpendicular to the drawing plane of FIG. 3, is selected to be large compared to the thickness d of the semiconductor body, but otherwise can be selected at random. Moreover, the length $l$ of the semiconductor body in the drift direction between the two ohmic contacts 2*a* and 2*b* is selected to be substantially greater than the transverse wavelength $\lambda_{tr}$. An external electric field is applied to the semiconductor body via contacts *a* and 2*b* by the bias source 3 in such a manner that the charge carriers drift within the semiconductor body 1 from contact 2*a* to contact 2*b*. The supporting base of the semiconductor arrangement is provided by bodies 15 and 16 of dielectric material. The semiconductor layer or body 1 is applied thereto preferably in an epitaxial manner. To couple high frequency elecromagnetic power in and/or out of the semiconductor body 1, coupling means 10, 12 and 11, 13, respectively, are provided which effect the high frequency power connections with the semiconductor body 1. In the illustrated embodiment this is realized by respective oppositely disposed thin conductors or conductive coatings 10, 12 and 11, 13.

The arrangement according to the present invention is so constructed that the above-mentioned coupling means, i.e., 10, 12 and 11, 13, form a waveguide for the high frequency electromagnetic energy, e.g., in the form of a parallel wire line or preferably in the form of a stripline.

The waveguide 10, 12 on the input side as well as the waveguide 11, 13 on the output side are capacitively coupled to portions only of the semiconductor body 1. In the illustrated embodiment, the semiconductor body 1 is enclosed on both sides by the bodies 15 and 16 of dielectric material which, as illustrated, both have the same dimensions, thus providing a geometrically symmetrical arrangement in the Y direction. At the ends of the semiconductor body near the galvanic contacts 2a and 2b, the dielectric material 15 is relatively thin in order to provide the required coupling capacitance **14*a* or 14*b*, respectively, which is produced between the respective conductive element 10 or 11 and the closely opposing portion of semiconductor body 1. Dielectric material 16** is similarly constructed. The lengths $l_a$ and $l_b$, over which the capacitive coupling occurs, are here preferably selected to be less than $\lambda_l/2$.

Figure 4:
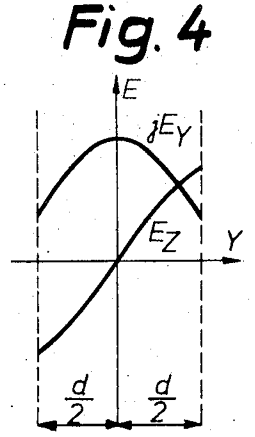
FIG. 4 shows the alternating electric field distribution in the semiconductor body of FIG. 3 for the amplified space charge wave for the lowermost antisymmetrical transverse order for transverse negative differential charge carrier mobility according to the invention.

FIG. 4 shows the alternating electric field distribution in the semiconductor body 1 according to the embodiment of the present invention shown in FIG. 3 for a growing or amplified space charge wave of the lowermost antisymmetrical transverse order for transverse negative charge carrier mobility.

Compared with the embodiment of FIG. 1, the arrangement of FIG. 3 has the advantage that the desired wave can be more easily excited in the semiconductor body. Moreover, the entire arrangement is very simple to produce and the connection of the bias source requires no additional decoupling members.

In a modification of the design shown in FIG. 4, the two bodies 15 and 16 of dielectric material can have different dimensions. Moreover, the conductive coatings 12 and 13, for example, may be combined into a common base plate, similar to the embodiment of FIG. 1. However, with a geometrically asymmetrical design in the Y direction it should be noted that the predetermined layer thickness d may deviate slightly from the above-indicated criterion as can be easily calculated by a person skilled in the art.

In a specific example the germanium layer 1 is grown epitaxially in its {001} plane on one side of the supporting base 8 in FIG. 1 or 15 in FIG. 3, consisting of semi isolating gallium arsenide or beryllium oxide. Then an island is etched out of the germanium layer by masking so that the width of the island is 100 $\mu m$ and the length l in <110> direction is 100 $\mu m$, too. The other side of the germanium layer then is covered by gallium arsenide or beryllium oxide so that the width D is about 50 $\mu m$.

A voltage of 75 Volt is applied between the contact $2a$ and $2b$ so that the drift velocity $v_0$ will be $8 \cdot 10^6$ cm/sec. The working frequency is about 10 GHz.

The embodyment of FIG. 1 when working in the lowermost order has a thickness $d$ of 7 $\mu m$ and 15 $\mu m$ for *next order*.

An embodyment as shown in FIG. 3 has a thickness $d$ of 3 $\mu m$ for the lowermost and 11 $\mu m$ for the next order. The reduction of the size of the body 15 and 16 at the ends for a length $l_a$ and $l_b$ of 4 $\mu m$ is choosen in such a manner that these reduced ends have a thickness of about 10 $\mu m$ each.

It will be understood that the above description of the present invention is susceptible to various modifications, changes and adaptations, and the same are intended to be comprehended within the meaning and range of equivalents of the appended claims.

I claim:

1. A semiconductor arrangement for the nonreciprocal amplification or generation of high frequency oscillations in the microwave range, comprising in combination: a relatively long and wide thin layer of semiconductor material of the type which exhibits a negative differential charge carrier mobility as the result of an applied critical field; means, including a pair of spaced ohmic contacts on said layer of semiconductor material, for applying a critical drift field to said semiconductor layer so that charge carriers drift therein in the longitudinal direction; first coupling means for coupling high frequency electromagnetic waves into said semiconductor layer in a manner so that the resulting high frequency electric fields exhibit field components which extend within the semiconductor layer in the direction of both its layer thickness and its length thereby exciting space charge waves in said semiconductor layer; similar second coupling means for coupling electromagentic power out of said semiconductor layer, thereby removing said space charge waves; said semiconductor layer exhibiting a transverse negative differential charge carrier mobility which extends in a direction perpendicular to the drift field and in the direction of the thickness of the semiconductor layer, and having a predetermined layer thickness $d$ in the direction of said transverse negative differential charge carrier mobility, where $d$ is related to the transverse wavelength $\lambda_{tr}$ of the space charge waves excited in the semiconductor layer; the length $l$ of said semiconductor layer in the drift direction being much larger than said transverse wave length $\lambda_{tr}$; and the width $b$ of said semiconductor layer perpendicular to the drift direction and perpendicular to the direction of said transverse negative differential charge carrier mobility being much larger than the layer thickness $d$.

2. The semiconductor arrangement as defined in claim 1 wherein said first and second coupling means couples the electromagnetic waves in and out of the semiconductor layer so that the coupling occurs symmetrically in the direction of said transverse negative differential charge carrier mobility.

3. The semiconductor arrangement as defined in claim 3 wherein said arrangement is geometrically symmetrical in the direction of the transverse negative differential charge carrier mobility and wherein the following conditions apply:

$$2n-1/2\,\lambda_{tr} < k < d < n\lambda_{tr}\,,$$

where $d$ is the thickness of the semiconductor layer in the direction of its transverse negative differential charge carrier mobility;

$\lambda_{tr}$ is the transverse wavelength of the space charge waves in the semiconductor layer;

$k$ is a critical thickness which is determined by the materials of the semiconductor layer and an adjacent dielectric material, and $$k \approx \lambda_{tr}/\pi \text{ arc tan } (-\lambda_l/\lambda_{tr} \cdot \epsilon^*_D/\epsilon_H);$$

$\lambda_l$ is the longitudinal wavelength of the symmetrical space charge waves in the semiconductor layers;

$\epsilon_H$ is the dielectric constant of the semiconductor material;

$\epsilon^*_D$ is the effective dielectric constant of a dielectric material around the semiconductor layer and;

4. The semiconductor arrangement as defined in claim 3 wherein said semiconductor layer is disposed on a surface of a body of dielectric material having a conductive base plate on the opposite surface thereof; and wherein said first and second means for coupling the electromagnetic waves in and out of said semiconductor layer includes said base plate and forms, together with said semiconductor layer, a waveguide for said electromagnetic waves.

5. The semiconductor arrangement as defined in claim 4 wherein said waveguide is of the stripline type.

6. The semiconductor arrangement as defined in claim 5 wherein said body of dielectric material is an insulating member which abuts the semiconductor layer on two opposite surfaces thereof and which is limited by two oppositely disposed conducting base plates.

7. The semiconductor arrangement as defined in claim 3 whrein said ohmic contacts are on both end surfaces of said semiconductor layer; wherein said means for applying a drift field to the semiconductor layer includes a bias source which is directly connected to said ohmic contacts via high frequency chokes; and wherein said coupling means includes a pair of conductors which form the inner conductor of a stripline, one of said pair of conductors being connected directly with the associated one of said ohmic contacts and the other of said pair of conductors being connected to the other of said ohmic contacts via a capacitor.

8. The semiconductor arrangement as defined in claim 3 wherein the semiconductor layer consists of a germanium layer of the <001 > crystal plane, and wherein said critical drift field is applied in the <110 > crystal direction.

9. The semiconductor arrangement as defined in claim 1 wherein said first and second coupling means couples the electromagnetic waves in and out of the semiconductor layer so that the coupling occurs antisymmetrically in the direction of said transverse negative differential charge carrier mobility.

10. The semiconductor arrangement as defined in claim 9 wherein said arrangement is geometrically symmetrical in the direction of the transverse negative differential charge carrier mobility; and wherein the conditions apply are met;

$$2n-1/2\,\lambda_{tr} > d > k' > (n-1)\,\lambda_{tr}$$

where $k'$ is a critical thickness which is determined by the materials of the semiconductor layer and an adjacent dielectric layer with $k' \approx \lambda_{tr}/\pi \text{ arc tan } (\lambda_{tr}/\lambda_l \cdot \epsilon_H/\epsilon^*_D)$ $d$ is the thickness of the semiconductor layer in the direction of its transverse negative differential charge carrier mobility;

$\epsilon_{tr}$ is the transverse wavelength of the antisymmetrical space charge waves in the semiconductor layer;

11. The semiconductor arrangement as defined in claim 10 wherein the semiconductor layer is supported on at least one surface thereof by a dielectric layer; and wherein said first an second coupling means include an input waveguide and an output waveguide respectively said waveguides extending over a portion of the outer surface of said dielectric layer at the associated ends thereof so that said waveguides are capacitively coupled with said semiconductor alyer along a portion of the length thereof via said dielectric layer.

12. The semiconductor arrangement as defined in claim 11 wherein dielectric layers of equal dimensions are provided on the opposed surfaces of said semiconductor layer.

13. The semiconductor arrangement as defined in claim 11 wherein the respective lengths of the capacitive couplings between the waveguides and the semiconductor layer are selected to be less than $\lambda_l/2$.

* * * * *